United States Patent [19]

Jeudi et al.

[11] Patent Number: 4,901,130
[45] Date of Patent: Feb. 13, 1990

[54] PROTECTION THYRISTOR WITH AUXILIARY GATE

[75] Inventors: Patrice Jeudi, La Membrolle; Christine Anceau, Saint Pierre des Corps, both of France

[73] Assignee: SGS-Thomson Microelectronics S.A., Gentilly, France

[21] Appl. No.: 214,255

[22] Filed: Jul. 1, 1988

[30] Foreign Application Priority Data

Jul. 3, 1987 [JP] Japan .................................. 62-09457

[51] Int. Cl.$^4$ ..................... H01L 29/74; H01L 29/06; H01L 29/747
[52] U.S. Cl. ......................................... 357/38; 357/20; 357/39
[58] Field of Search ............................... 357/38, 20, 39

[56] References Cited

U.S. PATENT DOCUMENTS 3,315,138 4/1967 Allison ................................. 357/20
3,697,827 10/1972 Simon .................................. 357/34
4,156,248 5/1979 Neilson ............................... 357/38
4,314,266 2/1982 Temple ............................... 357/38
4,618,781 10/1986 Silber et al. ......................... 357/38

Primary Examiner—Rolf Hille
Assistant Examiner—Robert P. Limanek
Attorney, Agent, or Firm—Lowe, Price, LeBlanc, Becker & Shur

[57] ABSTRACT

The instant invention relates to protection semiconductive components, thrystors or triacs. Those components do not usually comprise gate electrodes and are triggered by an overvoltage between the main electrodes. When one wishes to obtain however a gate triggering, the invention provides for a structure with a narrowed region of the gate (part D) and an overdoped central region (22) below a portion of the emitter (18). With this structure, one avoids to have a too high gate current to trigger the thyristor and a too low hold current once it is triggered.

1 Claim, 1 Drawing Sheet

PROTECTION THYRISTOR WITH AUXILIARY GATE

BACKGROUND OF THE INVENTION

The instant invention relates to protection thyristors and triacs.

A protection thyristor or triac is a component with two main electrodes that can be located between two terminals of a circuit to be protected, for example, between the terminals of a telephone set, between the current supply terminals of a circuit, etc. The protection thyristor is normally non-conductive but becomes conductive when it receives through its terminals a reverse-polarity voltage overcoming a well-determined threshold that is called break-over voltage. Under direct polarity voltages, the thyristor is blocked.

The protection triac is non-conductive for both polarities but becomes conductive over a certain threshold (break-over voltage) for the direct polarity as well as for the reverse polarity.

In the hereinunder description, the protection thyristors only will be mentioned, the invention being also applicable to a triac constituted of two reverse-connected thyristors.

The protection thyristors are distinguished from the conventional switching thyristors not only by their inner structure, in which the diffusion profiles of the various regions are chosen for carrying out the automatic triggering function that is assigned to them (triggering for as accurate a voltage as possible, but also by the fact they do not have gate electrodes.

SUMMARY OF THE INVENTION

According to the instant invention, it has been noted that under certain applications it could prove useful that the protection thyristor, the function of which is to short-circuit the two terminals of a circuit to be protected, may be triggered by sake of protection non only whenever an overvoltage appears on its terminals, but also under certain circumstances requiring a protection for example in case of an abnormal overheating of the circuit to be protected.

That is the reason why the instant invention provides for incorporating a gate into a protection thyristor or triac, the structure of which is carried out so as to maintain, without impairing its performances, the main function of the component, that is, its protection function.

The thyristor structure according to the invention comprises a P-type anode region, a N-type central region, a P-type gate region, a N-type emitter, or cathode, region, the central region being overdoped under an emitter metallization partially overlaying the emitter region, the gate region comprising a portion of small thickness at the place where it is adjacent to the overdoped region, and thicker portion at the place where it is adjacent to the remaining part of the central region, the emitter region extending in surface above the overdoped region and overlapping this region, a gate electrode being formed on the surface of the gate region in its thicker portion.

By using this structure, it has been appreciated that a very good separation of the two triggering functions of the thyristor can be achieved, that is, the triggering function by overcoming a voltage threshold (the protection function) and the triggering function by applying a gate current (controlled triggering function). The separation of the functions thus obtained avoids having to choose between a good protection thyristor and a good gate-controlled thyristor, a choice that would provide a thyristor of poor quality both in its protection function and in its controlled-component function.

More particularly, the structure according to the invention permits, if it so desired, to obtain a thyristor having a high hold current while having a low gate triggering current. The hold current is the threshold current Ih such as if the current flowing through the thyristor decreases below Ih, then the thyristor is automatically blocked. A high hold current is generally desirable for a protection component: in this way, when the current has been turned on in the presence of an overvoltage, it easily comes back to its blocked state as soon as the current flowing through it decreases, that is, as soon as the overvoltage having caused the triggering has disappeared.

For a thyristor controlled by a gate current, it is often interesting to have a low triggering current Ig (the minimum gate current that is necessary to turn on the thyristor).

It should be understood that in the conventional thyristors, the hold current and the gate-triggering current are strongly dependent, that is, if one wishes to increase the hold current, the gate-triggering current will also increase. Thanks to the structure according to the invention, both a strong hold current and a low triggering current can be obtained, without impairing the triggering function as a result of overvoltage between the main electrodes.

BRIEF DESCRIPTION OF THE DRAWINGS

These features and advantages of the invention will clearly appear in the following detailed description in connection with the attached drawings, wherein.

DETAILED DESCRIPTION OF THE INVENTION

Figure 1:
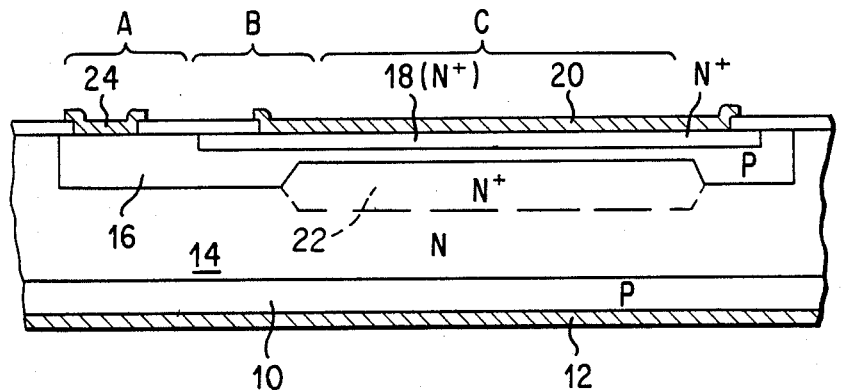
FIG. 1 shows a cross-section view of the thyristor according to the invention.

The cross-section of FIG. 1 clearly shows the various layers of the alternate conductivity types of the thyristor according to the invention (the invention also applies to a triac constituted of two reverse-connected thyristors, located side by side on a same integrated circuit chip).

The layers are as follows: a P-type anode layer 10 flushing on the back face and covered by an anode metallization 12; a N-type central layer 14; a P-type gate layer 16; a N-type emitter layer 18.

The emitter (also known as cathode) layer 18 is covered with an emitter metallization 20.

The central layer 14 comprises an overdoped, that is, highly doped, portion 22 adjacent to the gate layer 16; this overdoped portion penetrates inside the gate layer, so that the junction between the gate layer and the central layer presents a recess instead of being plane on practically its whole surface.

The gate layer is thus divided into a first portion where it is adjacent to a less doped region of the central layer and a second portion where it is adjacent to a more heavily doped region 22 of the central layer.

The first portion of the gate layer comprises an area A where it appears at the surface of the semiconductive layer, and an area B where it passes below the emitter region; indeed, the emitter region is diffused from the surface into a portion of the gate layer; in region A, a gate metallization 24 covers the flushing portion of the gate layer for providing a contact to this layer.

The second portion of the gate layer essentially comprises a region C in which the thickness of the gate layer is reduced (with respect to the thickness in region B) due to the presence of the overdoped region 22 that enters the gate layer.

As shown in FIG. 1, the emitter region spreads above the whole overdoped region 22, but also protrudes over this region since its covers the region B as well.

Figure 2:
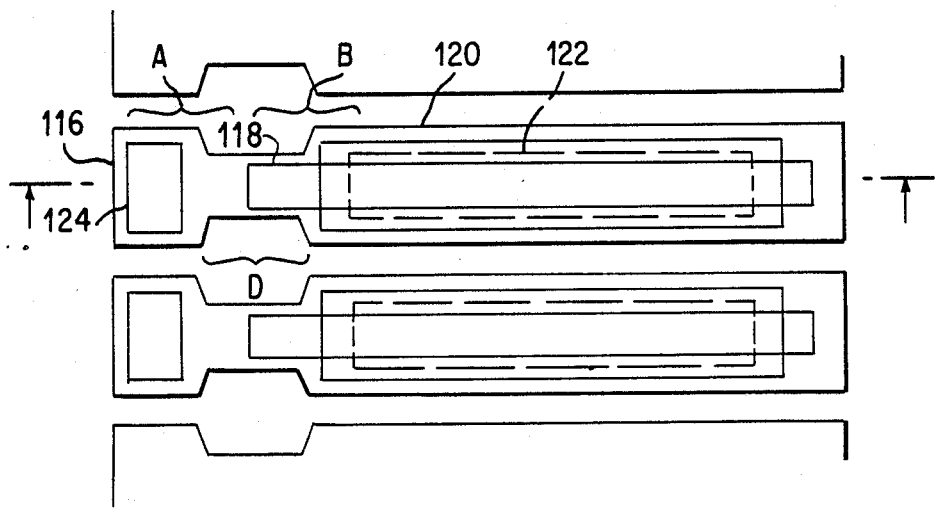
FIG. 2 shows the corresponding top view, in case of a comb structure.

In FIG. 2, showing a top view of the thyristor, the outlines of the various diffused regions, hereinabove mentioned, are shown, as well as the outlines of the metallizations of the front face.

The examplary structure is digited, that is, the gate region is subdivided into a plurality of individual regions in the form of parallel fingers electrically connected through a common gate electrode; similarly, the emitter region is subdivided into a plurality of finger-shaped regions, each emitter finger being diffused inside a respective gate finger and all the emitter fingers being interconnected through a common emitter electrode.

The outlines of the various regions are indicated on a single finger of the comb structure.

Reference 116 designates the outline, viewed from above, of the P-diffused region 16 constituting the gate layer.

Reference 118 designates the outline of the N-type emitter region diffused in a portion of the gate layer.

Reference 120 designates the outline of the emitter contact 20.

Reference 122 designates the outline, in dotted lines, of the N+overdoped region 22.

Reference 124 designates the outline of the gate contact 24.

In FIG. 2, it clearly appears that, in accordance with the invention, the gate region 16 comprises a portion having a narrowed width with respect to the width of this same region above the overdoped area 22. This portion of narrowed width is designated by reference D in FIG. 2. It is located into one or the other of the A and B regions or into both. In the example shown in FIG. 2, it partially protrudes over region A and partially over region B.

It will be understood that the emitter contact 20 protrudes over the emitter region 18 and is directly contacting the gate region on small lateral areas; this connection is used to extract the charges stored into the thyristor during its conduction phase, for facilitating the switching back of the thyristor into the off state.

By way of example, the overdoped portion 22 of the central layer 14 of the thyristor is about 10 times more doped that the remaining portion of the central layer. The width of the gate region in its narrow portion can be half the width of this region above the overdoped portion 22.

The structure can be carried out by means of the conventional diffusion and implantation processes; for example, from N-type semiconductive substrate that is superficially oxidized, the oxide is locally etched away in accordance with a pattern corresponding to the outline 122; N-type impurities are implanted; this implantation is later followed with a rediffusion of the impurities, this rediffusion causing the formation of region 22; in the oxide created during this rediffusion, a window corresponding to the outline 116 is etched, while the rear face of the layer is entirely deoxidized; an P-type impurity is diffused, thereby constituting the gate and anode regions; a new diffusion window is etched in accordance with a pattern corresponding to the outline 118 and an N-type impurity is diffused, causing the formation of the emitter region 18 inside the gate region and with an extension (area B) over the overdoped region 22; contact apertures are formed at the location of the gate contact and of the emitter contact (outlines 124 and 120), while the rear face of the layer is entirely deoxidized, and the metallization is carried out in the conventional way.

We claim:

1. A protection thyristor turning on whenever a predetermined voltage threshold between its anode and cathode is exceeded, comprising a P-type anode region (10), a N-type central region (14), a P-type gate region contact with the anode region, and a cathode electrode (20) in contact with the cathode region, the central region (14 comprising a highly doped region (22) below the cathode electrode, wherein:

the protection thyristor comprises a gate electrode (24) in contact with the gate region;

the gate region comprises a portion of little thickness (C) at the location where it is adjacent to the highly doped portion of the central region and a thicker portion (A, B) at the location where it is adjacent to the remaining portion of the central region the gate electrode being in contact with the gate region in its thicker part;

between the gate electrode and the highly doped region, the gate region presents a portion of narrowed width (D) with respect to the width of the region above the highly doped region;

the cathode region extends above said highly doped region and protrudes above said highly doped portion towards the gate electrode.

* * * * *